United States Patent [19]

Wu

[11] Patent Number: 5,398,000
[45] Date of Patent: Mar. 14, 1995

[54] SIMPLE AND HIGH SPEED BICMOS TRISTATE BUFFER CIRCUIT

[75] Inventor: Pan Wu, Aloha, Oreg.

[73] Assignee: Intel Corporation, Santa Clara, Calif.

[21] Appl. No.: 220,114

[22] Filed: Mar. 30, 1994

[51] Int. Cl.$^6$ .......................................... H03K 19/003
[52] U.S. Cl. .......................................... 326/9; 326/56; 326/110
[58] Field of Search ............... 307/443, 446, 473, 495, 307/570

[56] References Cited

U.S. PATENT DOCUMENTS

| | | |
|---|---|---|
| 4,649,294 | 3/1987 | McLaughlin . |
| 4,701,642 | 10/1987 | Pricer . |
| 4,703,203 | 10/1987 | Gallup et al. . |
| 4,730,132 | 3/1988 | Watanabe et al. . |
| 4,813,020 | 3/1989 | Iwamura et al. . |
| 4,866,304 | 9/1989 | Yu . |
| 4,999,523 | 3/1991 | Cham et al. ........... 307/446 X |
| 5,001,365 | 3/1991 | Murabayashi et al. ........ 307/443 X |
| 5,047,669 | 9/1991 | Iwamura et al. ........... 307/443 X |
| 5,049,765 | 9/1991 | Young et al. . |
| 5,068,548 | 11/1991 | El Gamel . |
| 5,083,048 | 1/1992 | Kashimura ........... 307/446 X |
| 5,107,142 | 4/1992 | Bhamidipaty . |
| 5,113,096 | 5/1992 | Lev et al. . |
| 5,146,118 | 9/1992 | Nakamura et al. . |
| 5,153,464 | 10/1992 | Joly ........... 307/473 |
| 5,300,829 | 4/1994 | Lev et al. ........... 307/446 |

FOREIGN PATENT DOCUMENTS

| | | |
|---|---|---|
| 0058958A | 9/1982 | European Pat. Off. . |
| 0383554A | 8/1990 | European Pat. Off. . |
| 0490243A | 6/1992 | European Pat. Off. . |

*Primary Examiner*—David R. Hudspeth
*Attorney, Agent, or Firm*—Blakely, Sokoloff Taylor & Zafman

[57] ABSTRACT

A simple and high speed BiCMOS tristate buffer circuit includes a first transistor coupled to a power supply and a first node. The first transistor has a control terminal coupled to receive a first signal. A second transistor is coupled to the first node and ground. The second transistor has a control terminal coupled to receive a second signal. A first bipolar transistor has a base coupled to the first node, a collector coupled to the power supply, and an emitter coupled to an output node of the circuit. A third transistor is coupled to the output node and the ground. The third transistor has a control terminal coupled to receive the second signal. A switching circuit is coupled to the first node and the output node for connecting the first node to the output node when the first and second signals turn off the first, second, and third transistors such that the output node assumes an open circuit condition. The switching circuit is controlled by a third signal. The first, second, and third signals control the first and second transistors and the switching circuit to provide a path from the first input signal to the output node containing only one inverter, one P-channel transistor, and one bipolar transistor. This path allows the buffer circuit to have high switching speed and simple circuit structure. A logic circuit is coupled to receive a first input signal and a second input signal for generating the first, second, and third signals.

16 Claims, 4 Drawing Sheets

| $D_{IN}$ | EN | $D_{IN1}$ | $D_{IN2}$ | $\overline{EN}$ | TRANSISTOR 74 | TRANSISTOR 75 | TRANSISTOR 76 | TRANSISTOR 77 | OUTPUT |
|---|---|---|---|---|---|---|---|---|---|
| 0 | 0 | 1 | 0 | 1 | OFF | OFF | ON | ON | TRISTATE |
| 0 | 1 | 1 | 1 | 0 | OFF | ON | OFF | OFF | 0 |
| 1 | 0 | 1 | 0 | 1 | OFF | OFF | ON | ON | TRISTATE |
| 1 | 1 | 0 | 0 | 0 | ON | OFF | OFF | OFF | 1 |

*Figure 4*

SIMPLE AND HIGH SPEED BICMOS TRISTATE BUFFER CIRCUIT

FIELD OF THE INVENTION

The present invention pertains to the field of very large scale integrated ("VSLI") circuits used in computers. More particularly, this invention relates to a simple and high speed tristate buffer circuit that employs bipolar and complementary Metal-Oxide-Silicon ("BiCMOS") devices, wherein the BiCMOS tristate buffer circuit permits high speed switching operation and occupies minimized silicon substrate area.

BACKGROUND OF THE INVENTION

Digital logic circuits which combine bipolar and complementary Metal-Oxide-Silicon ("CMOS") technologies in a single integrated circuit have been developed. A digital logic circuit that combines bipolar and CMOS technologies is particularly advantageous since the superior aspects of each may be exploited to yield optimal circuit performance.

For example, CMOS circuits have the advantages of extremely low quiescent power consumption, rail to rail output capability, high density, and a very high input impedance. Bipolar logic circuits, on the other hand, are useful in driving large capacitive loads, have fast switching capabilities, and feature better performance over temperature and power supply. These attributes have led to the development of a family of BiCMOS logic circuits which employ bipolar transistors to drive output loads, while utilizing CMOS devices to perform the basic logic functions.

One type of prior BiCMOS circuit is a BiCMOS tristate buffer. A BiCMOS tristate buffer typically provides as output a first voltage equivalent to a binary one condition, a second voltage equivalent to a binary zero condition, and an open circuit condition. The tristate buffers are used in many integrated circuit systems because it is typically desirable that when many different circuits are connected together to form a system, the circuit that drives its subsequent circuits should appear as though it does not exist in the system when that particular circuit does not drive its subsequent circuits.

One type of prior art BiCMOS tristate buffer circuit 10 is shown in FIG. 1. FIG. 2 illustrates the circuit of another type of prior art BiCMOS tristate buffer circuit 40. Referring to FIG. 1, BiCMOS tristate driver or buffer circuit 10 includes a pair of P-channel Metal-Oxide-Silicon field effect transistors ("PMOSFETs") 12 and 14 that are serially connected to a power supply $V_{CC}$ and a node 15. A pair of N-channel MOSFETs 16 and 18 are connected in parallel between node 15 and ground. A bipolar transistor 20 has its base connected to node 15, its collector connected to the power supply $V_{CC}$, and its emitter connected to an output node 25. A bipolar transistor 21 is connected between output node 25 and ground. The base of transistor 21 is connected to ground via a pair of transistors 26 and 28. Transistors 26 and 28 are connected together in parallel. The base of transistor 21 is also connected to output node 25 via a pair of serially connected transistors 22 and 24.

Transistors 14, 16, and 24 receive a DATA IN signal. Transistors 12, 18, and 28 receive an $\overline{\text{ENABLE}}$ signal and transistor 22 receives an ENABLE signal which is the inverting signal of the $\overline{\text{ENABLE}}$ signal. The gate of transistor 26 is connected to node 15. When the ENALBE signal is logically high, transistor 22 is on and transistors 18 and 28 are switched off by the logical low $\overline{\text{ENABLE}}$ signal. Transistor 12 is, however, switched on. At this time, if the DATA IN signal is logically low, transistor 20 is turned on and transistor 26 is turned on which turns off transistor 21. This causes output node 25 to output a logical high voltage. If the DATA IN signal is, however, logically high, transistor 20 is off. Meanwhile, transistor 24 is turned on which causes transistor 21 to be diode connected, connecting output node 25 to ground. This causes output node 25 to output a logical low voltage.

When the ENABLE signal is logically low, transistors 18 and 28 are both on, turning both transistors 20 and 21 off. The causes output node 25 to float which presents the open circuit condition.

Disadvantages are, however, associated with this prior art BiCMOS tristate driver circuit. One disadvantage associated is that when another circuit connected also to output node 25 drives the output node high when node 25 is caused to float by transistors 20-21, a negative base-emitter voltage (i.e., $-V_{BE}$) is developed across the base and emitter junction of transistor 20. If the condition remains for some time, then the operation of the circuit may be degraded after certain period of time or may fail after repeated applications of such negative $V_{BE}$ voltage.

One prior solution to this problem is shown in FIG. 2. Referring to FIG. 2, BiCMOS tristate buffer circuit 40 includes a first bipolar transistor 47 connected to the power supply $V_{CC}$ and an output node 48 and a second bipolar transistor 53 connected between output node 48 and ground. The base of transistor 47 is connected to a node 44 which is then connected to a DATA IN signal via an inverter 41 and a transmission gate formed by transistors 42 and 43. Another transmission gate formed by transistors 45 and 46 is connected between nodes 44 and 48. The two transmission gates are controlled by the ENABLE signal and its inverting signal $\overline{\text{ENABLE}}$ to be alternately turned on. The base of transistor 53 is connected to ground via a pair of transistors 51-52. A pair of transistors 49-50 are serially connected between output node 48 and the base of transistor 53.

During operation, when the ENABLE signal is logically high, circuit 40 operates as an inverting driver circuit and output node 48 generates a logical low voltage when the DATA IN signal is logically high, and a logical high voltage when the DATA IN signal is logically low.

When, however, the ENABLE signal is logically low, the transmission gate formed by transistors 42-43 disconnects node 44 from inverter 41, causing node 44 to float. At this time, the transmission gate formed by transistors 45-46 connects nodes 44 and 48 together. Transistor 53, meanwhile, is turned off by the conducting transistor 51, causing the circuit to be in the open circuit condition. Because the transmission gate formed by transistors 45-46 connects nodes 44 and 48 together, transistor 47 is bypassed and no negative $V_{BE}$ voltage is developed on transistor 47.

The prior art BiCMOS tristate inverter of FIG. 2, however, still bears disadvantages. One disadvantage of the circuit is that by employing the transmission gate along the path to the base of transistor 47, the switching speed of the circuit is adversely affected. This is due to the fact that the transmission gate embeds a resistance into the path, which typically slows the signal transmission to transistor 47.

Another disadvantage associated with the circuit of FIG. 2 is that a relatively large number of transistors are employed to configure the circuit. Note that one CMOS inverter used to generate the $\overline{\text{ENABLE}}$ signal from the ENABLE signal is not shown in FIG. 2, and for a non-inverting stage, another CMOS inverter should be used to convert the DATAIN signal to a $\overline{\text{DATAIN}}$ signal. This typically causes the circuit to occupy more space on the silicon substrate. In addition, the circuit typically requires relatively high power consumption because of the relatively large number of transistors in the circuit.

SUMMARY AND OBJECTS OF THE INVENTION

One of the objects of the present invention is to provide a BiCMOS tristate buffer that permits high speed switching operation.

Another object of the present invention is to provide a BiCMOS tristate buffer that occupies minimized silicon substrate area.

Another object of the present invention is to provide a BiCMOS tristate buffer that is capable of operating at low power supply potentials and consumes minimized power consumption.

A further object of the present invention is to provide a BiCMOS tristate buffer that has minimized input capacitance.

A still further object of the present invention is to provide a BiCMOS tristate non-inverting buffer that operates at relatively high speed, requires minimized power consumption, and has minimized input capacitance. In addition, the buffer requires minimized silicon substrate area and can operate at low power supply potentials.

A BiCMOS tristate buffer circuit includes a first transistor coupled to a power supply and a first node. The first transistor has a control terminal coupled to receive a first signal. A second transistor is coupled to the first node and ground. The second transistor has a control terminal coupled to receive a second signal. A first bipolar transistor has a base coupled to the first node, a collector coupled to the power supply, and an emitter coupled to an output node of the circuit. A third transistor is coupled to the output node and the ground. The third transistor has a control terminal coupled to receive the second signal. A switching circuit is coupled to the first node and the output node for connecting the first node to the output node when the first and second signals turn off the first, second, and third transistors such that the output node assumes an open circuit condition. The switching circuit is controlled by a third signal.

The BiCMOS tristate buffer circuit also includes a logic circuit coupled to receive a first input signal and a second input signal for generating the first, the second, and the third signal. The first, second, and third signals are used to control the first and second transistors and the switching circuit. This results in a path from the first input signal to the output node containing only one inverter, one P-channel transistor, and one bipolar transistor that allows high speed switching operation and simple circuit structure. When the second input signal is in a non-enabling voltage state, the first and second signals turn off the first, second, and third transistors and the third signal causes the switching circuit to connect the first node to the output node to allow the output node to assume an open circuit condition.

Other objects, features, and advantages of the present invention will be apparent from the accompanying drawings and from the detailed description that follows below.

BRIEF DESCRIPTION OF THE DRAWINGS

The present invention is illustrated by way of example and not limitation to the figures of the accompanying drawings, in which like references indicate similar elements and in which:

FIG. 4 is a table showing the condition of the output node and some transistors of the tristate buffer circuit of FIG. 3 with respect to the input signals.

DETAILED DESCRIPTION

Figure 3:
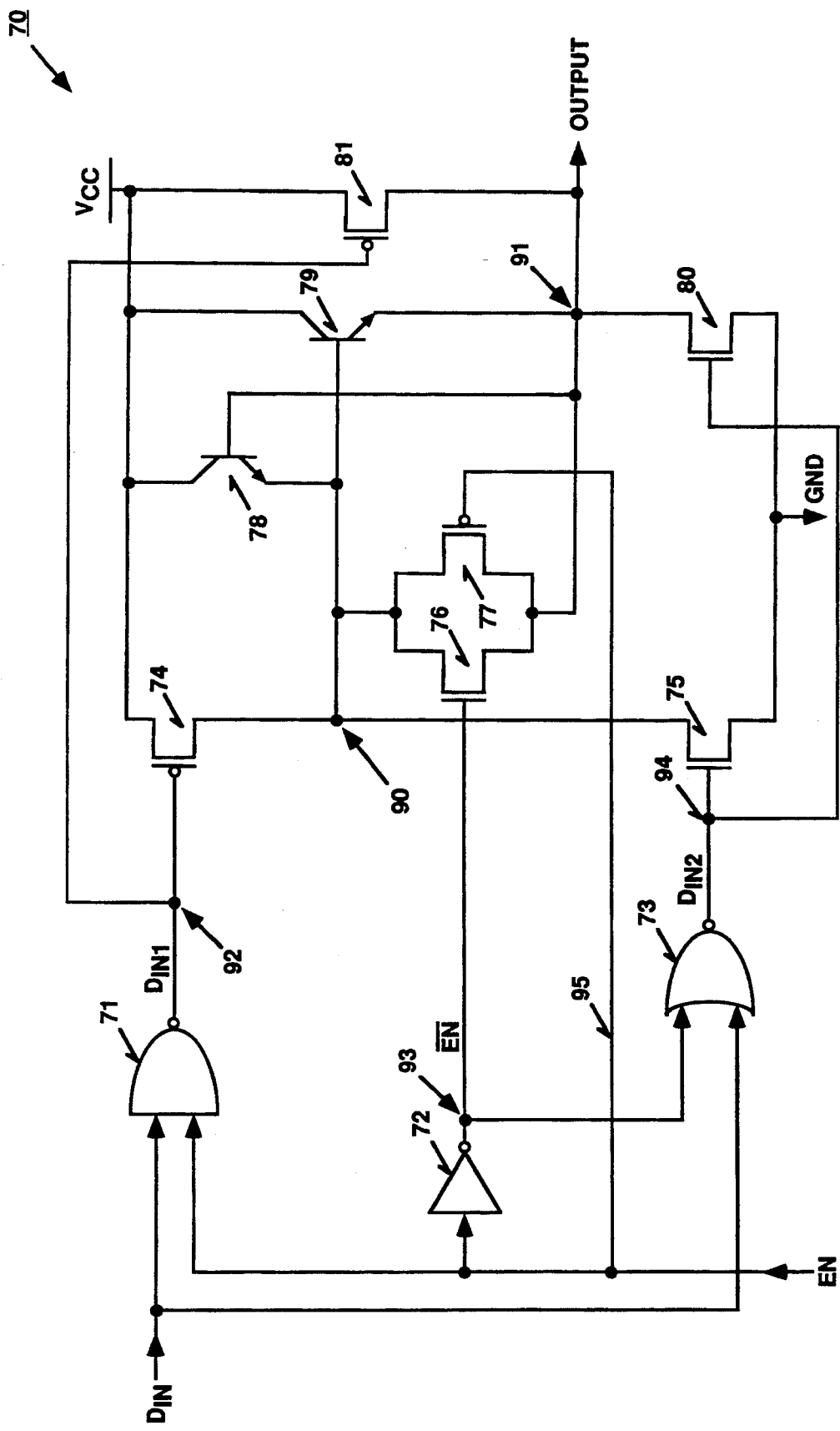
FIG. 3 is a circuit diagram of a BiCMOS tristate buffer circuit in accordance with one embodiment of the present invention.

FIG. 3 illustrates a BiCMOS tristate buffer circuit 70 which implements one embodiment of the present invention. As can be seen from FIG. 3, buffer circuit 70 receives a data signal $D_{IN}$ and an enable signal EN. Buffer circuit 70 provides an output signal OUTPUT. FIG. 3 shows buffer circuit 70 in a non-inverting configuration. Alternatively, buffer circuit 70 can be constructed in an inverting configuration by connecting, for example, an additional inverter to the $D_{IN}$ signal.

In functional terms, BiCMOS tristate buffer circuit 70 is used to buffer the input data $D_{IN}$ to its output OUTPUT when the enable signal EN is logically active. When the enable signal EN is logically inactive, the output OUTPUT of buffer circuit 70 presents an open circuit condition. The configuration of buffer circuit 70 and its function will be described in more detail below, in conjunction with FIGS. 3–4.

BiCMOS tristate buffer circuit 70 includes transistors 74 through 81. For one embodiment, transistors 74-77 and 80-81 are metal-oxide-silicon field effect transistors ("MOSFETs"), and transistors 78 and 79 are bipolar transistors. Alternatively, other types of devices or transistors may be used for transistors 74-81.

For one embodiment shown in FIG. 3, transistors 74 and 75 are connected in CMOS configuration and transistor 80 and 81 are also connected in CMOS configuration.

Transistor 74 is connected between a power supply $V_{CC}$ and a node 90. Transistor 75 is connected between node 90 and ground. Transistor 81 is connected between the power supply $V_{CC}$ and an output node 91. Output node 91 provides the output signal OUTPUT. Transistor 80 is connected between output node 91 and ground. Transistors 74 and 81 are P-channel transistors and transistors 75 and 80 are N-channel transistors. Transistor 81 is used in buffer circuit 70 to pull the voltage level at output node 91 up to the $V_{CC}$ voltage when the OUTPUT signal is a logical high signal such that buffer circuit 70 achieves the rail-to-rail output capability (i.e., the full CMOS voltage swing). Alternatively, buffer circuit 70 may or may not include transistor 81.

Transistor 80 is used in buffer circuit 70 to connect output node 91 to ground when the OUTPUT signal is a logical low signal. For an alternative embodiment, transistor 80 can be replaced by a bipolar transistor and several MOS transistors with appropriate connections.

The gate of each of transistors 74 and 81 is connected to a node 92 for receiving a $D_{IN1}$ signal. The gate of each of transistors 75 and 80 is connected to a node 94 for receiving a $D_{IN2}$ signal. The $D_{IN1}$ and $D_{IN2}$ signals will be described below. Output node 91 is connected to node 90 via transistors 76 and 77. Output node 91 is also connected to node 90 via bipolar transistor 79. Transistors 76-77 constitute a transmission gate between nodes 90 and 91. As can be seen from FIG. 3, transistor 76 is an N-channel transistor and transistor 77 is a P-channel transistor. Alternatively, either of transistors 76 and 77 may be removed, but not both. Also, other switching devices, such as bipolar transistors, may be used.

Bipolar transistor 79 is connected between output node 91 and the power supply $V_{CC}$. The base of bipolar transistor 79 is connected to node 90. Bipolar transistor 79 is configured as an emitter follower of node 90. The function of transistor 79 is to couple the condition at node 90 to output node 91 and to drive a relatively large capacitive load connected to output node 91 when transistor 79 is conducting. Bipolar transistor 79 also provides relatively high speed switching when a relatively large capacitive load is connected to output node 91.

For one embodiment, bipolar transistor 79 is an NPN bipolar transistor. Alternatively, bipolar transistor 79 can be other type of transistor.

The power supply $V_{CC}$ for buffer circuit 70 can be a regular voltage power supply or a low voltage power supply. For one embodiment, $V_{CC}$ is approximately 5 volts. For another embodiment, $V_{CC}$ is approximately 3.3 volts. For alternative embodiments, $V_{CC}$ can be higher than 5 volts or lower than 3.3 volts.

Transistor 78 is connected between the $V_{CC}$ power supply and node 90. The base of transistor 78 is, however, connected to output node 91. For one embodiment, transistor 78 is an NPN bipolar transistor. For alternative embodiments, transistor 78 can be an N-channel MOS transistor.

Transistor 78 is configured as an emitter follower of output node 91. The function of transistor 78 is to eliminate the back biasing problem of butter circuit 70 when the enable signal EN is on. In other words, the use of bipolar transistor 78 in buffer circuit 70 ensures that no back bias can be applied to the emitter-base junction of transistor 79 when transistor 79 is turned off and when the transmission gate formed by transistors 76-77 is switched off. As is known, the back bias is caused by a negative base-emitter voltage developed across the base and emitter of transistor 79. The back bias problem during the enabling state of buffer circuit 70 is eliminated by transistor 78. When transistor 79 is off and when a high voltage is applied to output node 91, transistor 78 is turned on, coupling the high voltage from output node 91 to node 90. This causes the high voltage applied at output node 91 to bypass the base-emitter junction of transistor 79, thus eliminating the back bias problem to transistor 79.

Transistor 78 may or may not be used in buffer circuit 70. When the power supply $V_{CC}$ is lower than 3.3 volts, buffer circuit 70 may not include transistor 78.

The $D_{IN1}$ signal is generated by an NAND gate 71. NAND gate 71 has its output connected to node 92 for supplying the $D_{IN1}$ signal. NAND gate 71 receives the $D_{IN}$ and EN signals. As described above, the $D_{IN}$ signal is the data input signal for buffer circuit 70 and the EN signal is the enable signal for buffer circuit 70. The EN signal is also applied to transistor 77 and to transistor 76 via an inverter 72. Inverter 72 generates an $\overline{EN}$ signal which is the inverting signal of the EN signal. The $\overline{EN}$ signal is also applied to a NOR gate 73. NOR gate 73 generates the $D_{IN2}$ signal that is applied to node 94. The other input of NOR gate 73 is the $D_{IN}$ signal.

The function of NAND gate 71 and NOR gate 73 is to generate the $D_{IN1}$ and $D_{IN2}$ signals that switch off both transistors 74 and 75 when the EN signal is inactive, and that alternately turn on transistors 74 and 75 in accordance with the $D_{IN}$ signal when the EN signal is active. FIG. 4 illustrates the logic table that shows the condition of transistors 74-77 and the output of the circuit with respect to the $D_{IN}$, EN, $D_{IN1}$, $D_{IN2}$, and $\overline{EN}$ signals, which will be described in more detail below.

Referring to FIGS. 3 and 4, during operation, when the EN signal is logically active (i.e., logically high), buffer circuit 70 is in the enabling state or driving state. At this time, transistors 76 and 77 are both turned off and the output OUTPUT of circuit 70 is a function of the $D_{IN}$ signal. When the $D_{IN}$ signal is logically low, the $D_{IN1}$ and $D_{IN2}$ signals are both logically high, turning transistor 74 off and transistor 75 on (see FIG. 4). This in turn causes node 90 to be connected to ground. Meanwhile, transistor 80 is turned on by the logical high $D_{IN2}$ signal and transistor 81 is turned off by the logical high $D_{IN1}$ signal. Transistor 79 is also turned off as the base of transistor 79 receives a ground voltage. This causes output node 91 to output a logical low signal (see FIG. 4).

If, at this time, output node 91 experiences a high voltage driven by other devices connected to output node, transistor 78 comes into play which couples the high voltage at output node 91 to node 90. In other words, transistor 78 acts as a clamp diode to prevent the back bias from occurring to transistor 79. This therefore protects transistor 79 from being damaged by any high voltage applied at output node 91 when transistor 79 is turned off.

When the $D_{IN}$ signal is logically high, the $D_{IN1}$ and $D_{IN2}$ signals are both logically low, turning transistor 74 on and transistor 75 off (see FIG. 4). This in turn causes node 90 to be charged to the $V_{CC}$ voltage. Meanwhile, transistor 81 is on and transistor 80 is off. Transistor 79 is also turned on by the high voltage at node 90. This causes output node 91 to output a logical high signal. As described above, transistor 81 is used at this time to pull the voltage at output node 91 to the $V_{CC}$ voltage because transistor 79 can pull the output voltage up only to $V_{CC}-V_{BE}$.

When the EN signal is logically inactive (i.e., logically low), buffer circuit 70 is in the non-enabling state or tristate. At this time, transistors 76 and 77 are both turned on, coupling output node 91 to node 90. The inactive EN signal also causes NAND gate 71 to generate a logical high $D_{IN1}$ signal and NOR gate 73 to generate a logical low $D_{IN2}$ signal no matter whether the data input $D_{IN}$ is a logical high or low signal. This causes both transistors 74 and 75 to be turned off. This in turn causes node 90 to float.

Meanwhile, transistors 80 and 81 are both turned off by the $D_{IN1}$ and $D_{IN2}$ signals. Because transistors 76 and 77 are both turned on, connecting output node 91 to node 90, output node 91 also floats, presenting an open circuit condition (i.e., tristated) (see FIG. 4).

When buffer circuit 70 is in the tristate condition, transistors 78 and 79 are both turned off. This is due to the fact that the turned-on transmission gate of transistors 76 and 77 connects output node 91 to node 90. When output node 91 is driven by other drivers connected to output node 91, the voltage at node 90 varies as the voltage change at output node 91. This results in output node 91 remaining in the open circuit condition and transistor 79 not experiencing any back bias at all.

Figure 1:
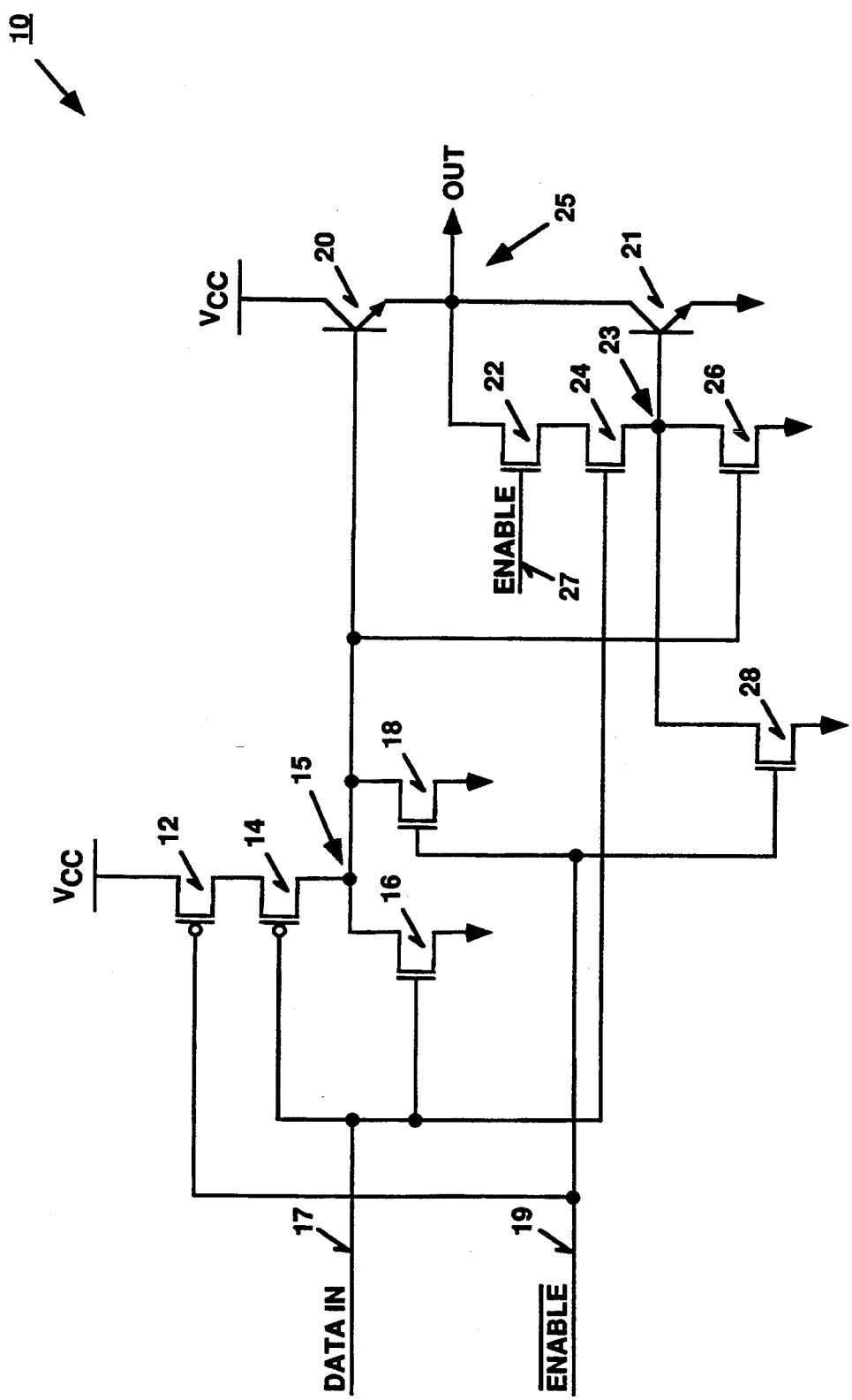
FIG. 1 is a circuit diagram of a prior art tristate buffer circuit.
Figure 2:
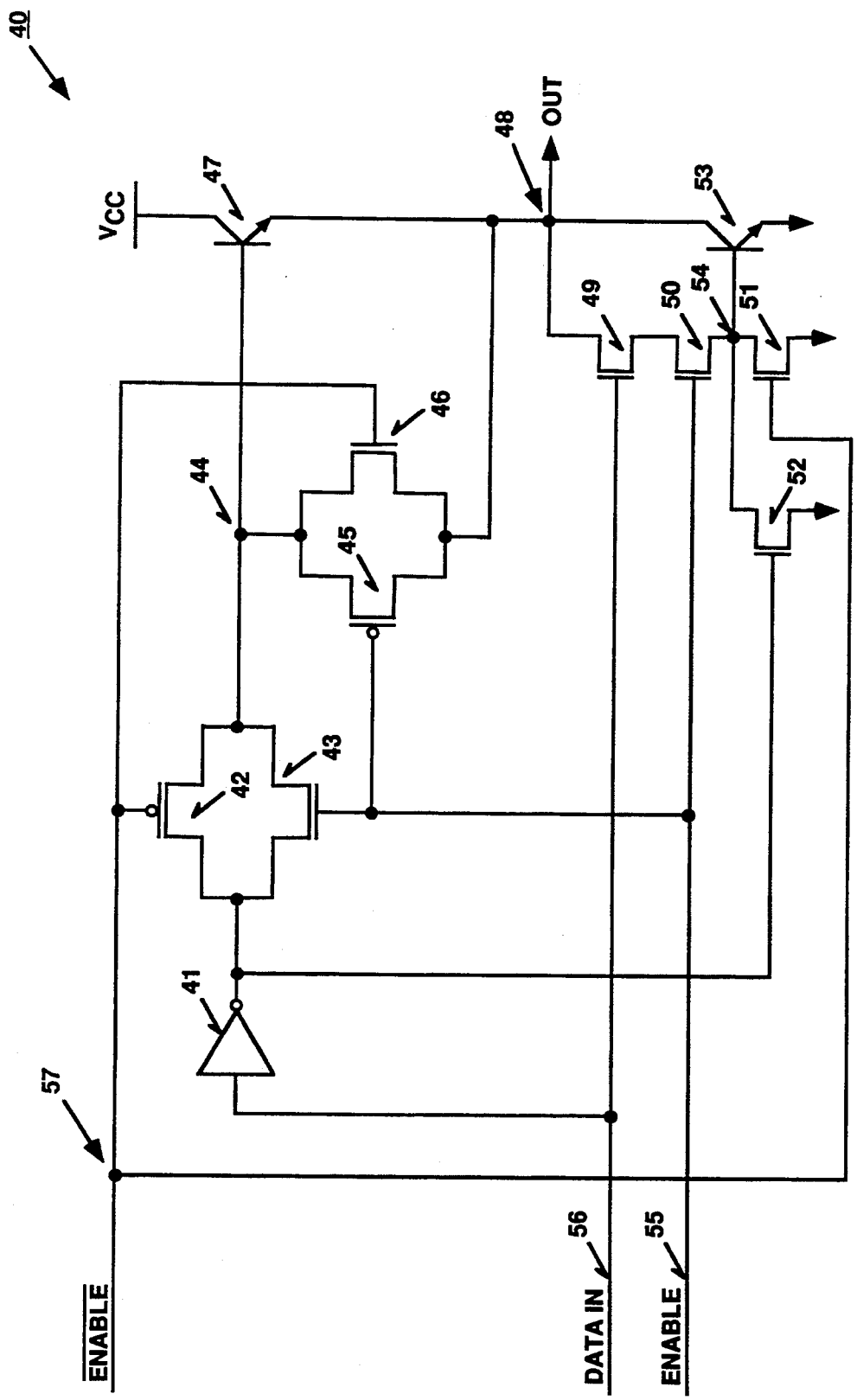
FIG. 2 is a circuit diagram of another prior art tristate buffer circuit.

Because transistors 74 and 75 are controlled by the $D_{IN1}$ and $D_{IN2}$ signals, respectively, node 90 can be made floating during tristate of the circuit. This allows output node 91 to float without waiting for transistor 79 to switch. In consideration of the circuit speed, gates 71 and 73 do not introduce an additional gate delay to the circuit because an inverting stage is also needed for the circuit in FIG. 1 or FIG. 2 to generate a non-inverting buffer. Particularly, only the high-to-low transition for NAND gate 71 and the low-to-high transition for NOR gate 73 are accounted for the speed consideration. This allows gates 71 and 73 to be configured as fast as inverters.

The configuration of buffer circuit 70 allows circuit 70 to have a high switching speed. In other words, the speed of buffer circuit 70 can be that of one CMOS inverter driving a BiNMOS inverter during the driving state, and that of one CMOS inverter only during the tristate. In addition, given that no stack transistors are used in buffer circuit 70, the circuit can operate in a low power supply voltage. Furthermore, as few circuit elements are used in circuit 70, the power consumption of the circuit is minimized and minimized silicon substrate area is used to manufacture the circuit.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A BiCMOS tristate buffer circuit, comprising:
   (A) a first transistor coupled to a power supply and a first node, wherein the first transistor has a control terminal coupled to receive a first signal;
   (B) a second transistor coupled to the first node and ground, wherein the second transistor has a control terminal coupled to receive a second signal;
   (C) a first bipolar transistor having a base coupled to the first node, a collector coupled to the power supply, and an emitter coupled to an output node of the circuit;
   (D) a third transistor coupled to the output node and the ground, wherein the third transistor has a control terminal coupled to receive the second signal;
   (E) a switching circuit coupled to the first node and the output node for connecting the first node to the output node when the first and second signals turn off the first, second, and third transistors such that the output node assumes an open circuit condition, wherein the switching circuit is controlled by a third signal.

2. The BiCMOS tristate buffer circuit of claim 1, further comprising a logic circuit coupled to receive a first input signal and a second input signal for generating the first, second, and third signals such that when the second input signal is in a non-enabling voltage state, the first and second signals turn off the first, second, and third transistors and the third signal causes the switching circuit to connect the first node to the output node.

3. The BiCMOS tristate buffer circuit of claim 2, wherein when the second input signal is in an enabling voltage state, the output node assumes a voltage state of the first input signal, wherein the first input signal is a data input signal and the second input signal is an enable signal.

4. The BiCMOS tristate buffer circuit of claim 1, wherein the switching circuit is a transmission gate circuit.

5. The BiCMOS tristate buffer circuit of claim 1, further comprising a second bipolar transistor for protecting the first bipolar transistor from being damaged by a negative base-emitter voltage applied to the first bipolar transistor, wherein the second bipolar transistor has an emitter coupled to the first node, a collector coupled to the power supply, and a base coupled to the output node.

6. The BiCMOS tristate buffer circuit of claim 1, further comprising a fourth transistor coupled between the power supply and the output node for clamping the voltage of the output node to the power supply when the first bipolar transistor is conducting and the third transistor is turned off by the second signal.

7. The BiCMOS tristate buffer circuit of claim 6, wherein the first and fourth transistors are P-channel transistors and the second and third transistors are N-channel transistors.

8. A BiCMOS tristate buffer circuit, comprising:
   (A) a logic circuit coupled to receive a first input signal and a second input signal for generating a first signal, a second signal, and a third signal;
   (B) a first transistor coupled to a power supply and a first node, wherein the first transistor has a control terminal coupled to receive the first signal;
   (C) a second transistor coupled to the first node and ground, wherein the second transistor has a control terminal coupled to receive the second signal;
   (D) a first bipolar transistor having a base coupled to the first node, a collector coupled to the power supply, and an emitter coupled to an output node of the circuit;
   (E) a third transistor coupled to the output node and the ground, wherein the third transistor has a control terminal coupled to receive the second signal;
   (F) a switching circuit coupled to the first node and the output node for connecting the first node to the output node under control of the third signal when the first and second signals turn off the first, second, and third transistors such that when the second input signal is in a non-enabling voltage state, the first and second signals turn off the first, second, and third transistors and the third signal causes the switching circuit to connect the first node to the output node to allow the output node to assume an open circuit condition.

9. The BiCMOS tristate buffer circuit of claim 8, wherein when the second input signal is in an enabling voltage state, (1) the first and second signals are complementary signals with respect to the first input signal which cause the output node to assume a voltage state of the first input signal, and (2) the third signal assumes the non-enabling voltage state, wherein the first input signal is a data input signal and the second input signal is an enable signal.

10. The BiCMOS tristate buffer circuit of claim 8, wherein the switching circuit is a transmission gate circuit.

11. The BiCMOS tristate buffer circuit of claim 8, further comprising a second bipolar transistor for protecting the first bipolar transistor from being damaged by a negative base-emitter voltage applied to the first bipolar transistor, wherein the second bipolar transistor has an emitter coupled to the first node, a collector coupled to the power supply, and a base coupled to the output node.

12. The BiCMOS tristate buffer circuit of claim 8, further comprising a fourth transistor coupled between the power supply and the output node for clamping the voltage of the output node to the power supply when the first bipolar transistor is conducting and the third transistor is turned off by the second signal.

13. The BiCMOS tristate buffer circuit of claim 12, wherein the first and fourth transistors are P-channel transistors and the second and third transistors are N-channel transistors.

14. A BiCMOS tristate non-inverting buffer circuit, comprising:
(A) a first transistor coupled to a power supply and a first node, wherein the first transistor has a control terminal coupled to receive a first signal;
(B) a second transistor coupled to the first node and ground, wherein the second transistor has a control terminal coupled to receive a second signal;
(C) a first bipolar transistor having a base coupled to the first node, a collector coupled to the power supply, and an emitter coupled to an output node of the circuit;
(D) a third transistor coupled to the output node and the ground, wherein the third transistor has a control terminal coupled to receive the second signal;
(E) a transmission gate circuit coupled to the first node and the output node for connecting the first node to the output node under control of a third signal when the first and second signals turn off the first, second, and third transistors to allow the output node to assume an open circuit condition;
(F) a logic circuit coupled to receive a first input signal and a second input signal for generating the first, second, and third signals such that (1) when the second input signal is in a non-enabling voltage state, the first and second signals turn off the first, second, and third transistors and the third signal causes the transmission gate circuit to connect the first node to the output node to allow the output node to assume the open circuit condition, and (2) when the second input signal is in an enabling voltage state, (i) the first and second signals are complementary signals with respect to the first input signal which cause the output node to assume a voltage state of the first input signal, and (ii) the third signal assumes the non-enabling voltage state, wherein the first input signal is a data input signal and the second input signal is an enable signal;
(G) a second bipolar transistor for protecting the first bipolar transistor from being damaged by a negative base-emitter voltage applied to the first bipolar transistor when the first bipolar transistor is not conducting and when the transmission gate circuit does not connect the first node to the output node, wherein the second bipolar transistor has an emitter coupled to the first node, a collector coupled to the power supply, and a base coupled to the output node.

15. The BiCMOS tristate non-inverting buffer circuit of claim 14, further comprising a fourth transistor coupled between the power supply and the output node for clamping the voltage of the output node to the power supply when the first bipolar transistor is conducting and the third transistor is turned off by the second signal.

16. The BiCMOS tristate non-inverting buffer circuit of claim 15, wherein the first and fourth transistors are P-channel transistors and the second and third transistors are N-channel transistors.

* * * * *